United States Patent [19]

Lapsker

[11] 4,367,506
[45] * Jan. 4, 1983

[54] PROTECTIVE SYSTEM FOR ELECTRIC MOTORS

[76] Inventor: Arie Lapsker, Rehov Leah 19, Haifa, Israel

[ * ] Notice: The portion of the term of this patent subsequent to Mar. 9, 1999, has been disclaimed.

[21] Appl. No.: 154,240

[22] Filed: May 29, 1980

Related U.S. Application Data

[63] Continuation-in-part of Ser. No. 125,026, Feb. 27, 1980, Pat. No. 4,319,297.

[30] Foreign Application Priority Data

Jun. 5, 1979 [GB] United Kingdom ............... 791519

[51] Int. Cl.$^3$ .............................................. H02H 7/08
[52] U.S. Cl. ..................................... 361/31; 340/648; 361/23
[58] Field of Search ................. 361/31, 23, 42, 47–50; 340/635, 648

[56] References Cited

U.S. PATENT DOCUMENTS

3,611,036 10/1971 Edson .................................. 361/47
3,656,136 4/1972 Blair ................................. 361/31 X Primary Examiner—Reinhard J. Eisenzopf
Attorney, Agent, or Firm—Browdy and Neimark

[57] ABSTRACT

A low winding resistance protective system for electrical motors comprising sensing apparatus for coupling to at least one motor winding and for comparing the winding resistance of a motor when at rest to a predetermined threshold and for providing an output indication in response to exceedance of that threshold and decoupling apparatus for decoupling the at least one motor winding from the sensing apparatus such that high voltages applied to the at least one motor winding during operation of the motor are prevented from reaching the sensing apparatus. An embodiment particularly suitable for use with high voltage motors is also described.

15 Claims, 7 Drawing Figures

PROTECTIVE SYSTEM FOR ELECTRIC MOTORS

This is a continuation-in-part of U.S Pat. application Ser. No. 125,026, filed Feb. 27, 1980 now U.S. Pat. No. 4,319,297.

FIELD OF THE INVENTION

The present invention relates to safety sensing devices for use with electric motors and more particularly to apparatus for sensing motor conditions when the motor is at rest.

BACKGROUND OF THE INVENTION

Many types of safety sensing devices for motors are known in the patent literature and appear on the market. The vast majority of these sense motor characteristics and conditions during operation of the motor. The protective apparatus which operates only during running of the motor cannot, however, prevent motor burnouts which occur upon initial application of electrical power to the motor windings. Such burnouts result from the degradation of insulation resistance caused by condensation and contamination. The frequency of such occurrences is a function of the relative humidity, the concentration of airborne particles and temperature changes in the operating environment. It may be readily appreciated that contaminated or rugged environments may require motor protection against insulation degradation which results in motor burnout at start-up.

Protective devices have been proposed for use with electric motors to monitor the windings resistance at rest. U.S. Pat. No. 3,656,136 shows an electric motor with a safety sensing device. Here, a small current is applied to one winding of a motor, and the current level is monitored. Should it reach too high a level, indicating a low resistance leakage path to ground, an alarm indication is provided and a relay is activated preventing energization of the motor.

Another type of protective device is described in U.S. Pat. No. 3,611,036. Two motor terminals are connected to two input power lines through diodes in series with neon lamps and current limiting resistors. A ground in the motor produces a current flow through one or both lamps. A photosensitive resistor, in response to light from the lamps, activates a relay control circuit to open the input line to the motor, so that the motor cannot be turned on.

SUMMARY OF THE INVENTION

The present invention seeks to provide a low winding resistance protective system for electrical motors which is characterized by small size, ease of installation, and fail safe qualities which prevent damage thereto by high voltages used to operate the motor.

There is thus provided in accordance with an embodiment of the invention, a low winding resistance protective system for electrical motors comprising sensing means coupled to at least one motor winding for comparing the winding resistance of the motor when at rest to a predetermined threshold and for providing an output indication in response to exceedance of that threshold and means for decoupling the at least one motor winding from the sensing means such that high voltages thereon during operation of the motor are prevented from reaching the sensing means.

Further in accordance with an embodiment of the invention the sensing means comprises an operational amplifier.

Additionally in accordance with an embodiment of the invention, the system is designed for monitoring of an AC motor and the decoupling means comprise a relay responsive to the sensed energization of an electric motor for opening the circuit between the at least one winding and the sensing means.

Further in accordance with an embodiment of the invention there is provided a protective system particularly designed for use with high voltage electric motors, operating at 2000 volts and more.

In accordance with an alternative embodiment of the invention, the system is designed for monitoring of a DC motor and the decoupling means comprise a diode.

Additionally in accordance with an embodiment of the invention designed for monitoring of a DC motor, the sensing means receive power from a battery.

Additionally in accordance with an embodiment of the invention in which the sensing means receive power from a motor starter at high voltage, there are provided means for decoupling the sensing means from the motor starter power source during operation of the motor.

BRIEF DESCRIPTION OF THE DRAWINGS

The invention will be more fully understood and appreciated from the following detailed description taken in conjunction with the drawings in which.

Figure 1:
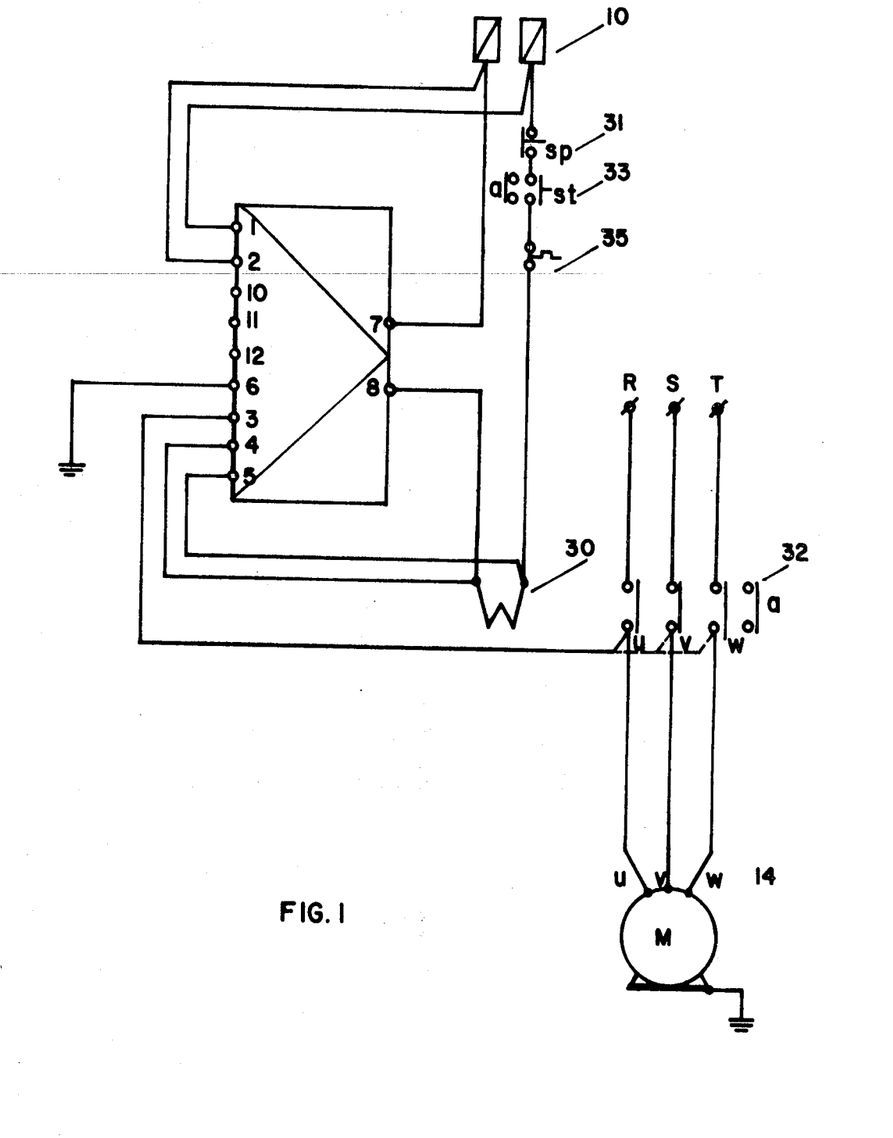
FIG. 1 is a schematic illustration of the electrical connections between the protective system of the present invention and a motor and motor starter.
Figure 2:
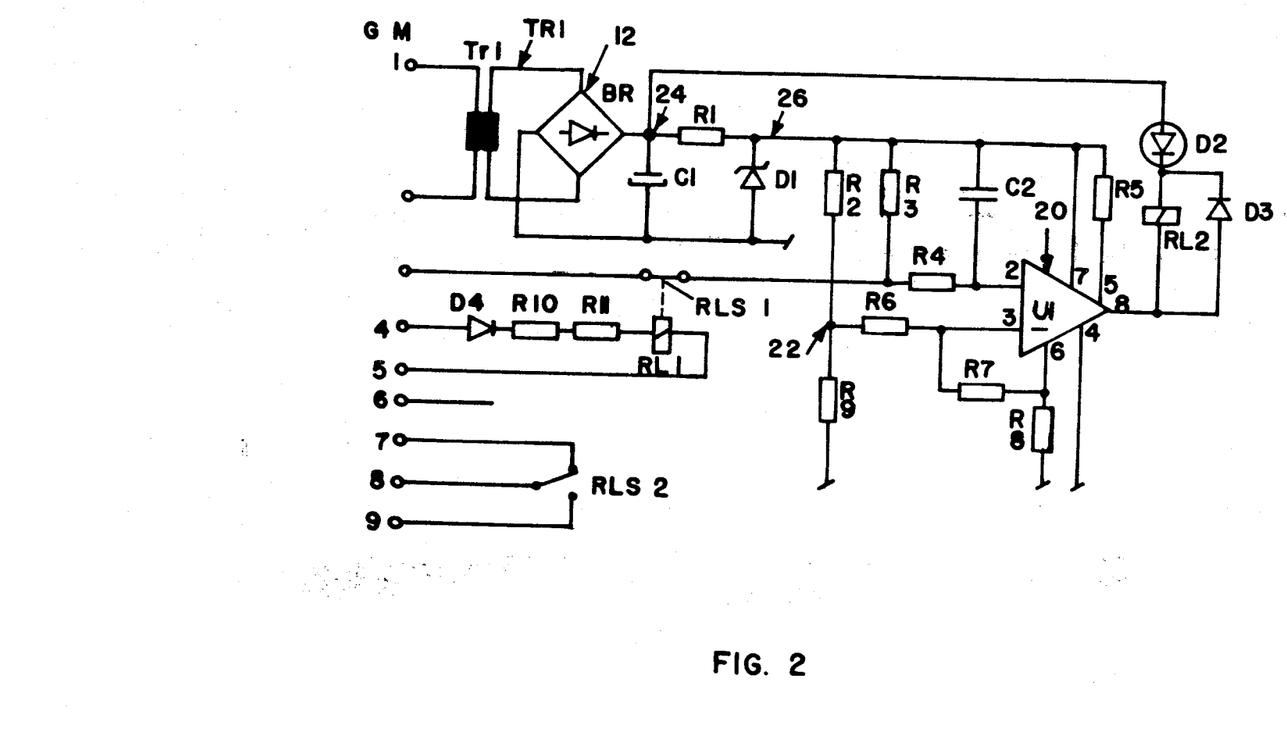
FIG. 2 is a schematic electrical diagram of sensing circuitry for an AC motor forming part of the protective system of the present invention.

Reference is now made to FIGS. 1 and 2 which respectively illustrate connections between the protective system of the present invention and a motor and motor starter on the one hand, and sensing circuitry forming part of the protective system on the other hand.

For the purposes of simplicity of explanation the various connections are identified with numbered terminals which are common to all of the illustrated embodiments of the invention. The particular numbering sequence has no significance whatsoever and any other numbering system or arrangement of terminals may alternatively be employed.

Terminals 1 and 2 are coupled to a source of electrical current 10, typically the control current applied across the contact coils of any conventional motor starter used in association with an electric motor. The control voltage applied across terminals 1 and 2 may be any suitable voltage such as 110–440 Volts. Terminals 1 and 2 are coupled to the primary winding of a transformer TR 1. The secondary windings of transformer TR 1 are coupled to a rectifier 12, the output of which is supplied as a 12 V DC power source to the remainder of the protective system.

Generally speaking the protective system may be understood as comprising apparatus for measuring the resistance between a winding of an electric motor 14 being monitored and ground. In the exemplary embodiment here considered, electric motor 14 is a three phase motor, having windings identified by the letters U, V and W which are connected to respective phase terminals identified by the letters R, S, and T. The invention is not necessarily limited to three phase motors and may be employed where suitable with any type of electrical motor.

Since the various windings U, V and W are interconnected electrically, the resistance measurement may be effected by connection with any one or more of the windings. In the present exemplary embodiment, terminal 3 is coupled to the U winding and terminal 6 is coupled to ground.

An operational amplifier 20, typically a Model CA 3094E of RCA Corporation serves as a comparator for comparing the resistance of the winding to ground against a predetermined threshold resistance. Amplifier input terminal 2 is coupled across a resistor R 4 and a relay controlled switch RLS 1 to terminal 3, which as noted above is connected to a motor winding. Negative input terminal 3 is coupled across a resistor R 6 to a junction 22. Junction 22 is coupled across a resistor R 9 to ground.

A junction 24 coupled to one output terminal of rectifier 12 is coupled across a capacitor C 1 to the second output terminal of the rectifier and is also coupled across a resistor R1 to a bus 26. A Zener diode D 4 is coupled between ground and bus 26. The junction between capacitor C 1 and the second output terminal of the rectifier is also coupled to ground. A resistor R 3 connects bus 26 to the junction of resistor R 4 and switch RLS 1 and a capacitor C 2 couples bus 26 to operational amplifier input terminal 2. Bus 26 is also coupled directly to terminal 7 of operational amplifier 20 and via a resistor R 5 to terminal 5 of operational amplifier 20.

Bus 26 is coupled to junction 22 via a resistor R 2 whose value determines the leakage resistance threshold of the protection system. The following table provides a list of values for R 2 in Kohms and the corresponding leakage resistance threshold values (Kohms) between terminal 3 and ground:

| Leakage Resistance | R 2 |
|---|---|
| 1010 | 91 |
| 800 | 120 |
| 650 | 150 |
| 500 | 200 |
| 285 | 360 |
| 210 | 510 |

It is understood that the above values are merely exemplary for the particular circuit illustrated in FIG. 2. Corresponding relationships of values for other specific embodiments can readily be determined by conventional empirical techniques.

Junction 24 is coupled via a light emitting diode D 2 in series with a parallel combination of a diode D 3 and a relay RL 2 to terminal 8 of operational amplifier 20. Terminal 4 of the operational amplifier is grounded and terminal 6 thereof is coupled via a resistor R 8 to ground and via a resistor R 7 to amplifier terminal 3.

It is a particular feature of the present invention that it is readily associatable with conventional motor starters and makes use of operating elements conventionally incorporated therein, thus eliminating duplication of switches and other components. An operating coil 30, forming part of the motor starter, operates a switch 32 which serves to govern the connection between a three phase mains supply at terminals R, S, and T and respective motor windings U, V and W, and also forms part of the motor starter. Coil 30 is conventionally energized from current source 10 via series connected start, stop and overload switches 31, 33 and 35 respectively.

It is a particular feature of the invention that in the series connection from current source 10 to coil 30 there is provided switch RLS 2, a series switch across terminals 7 and 8 which enables control of coil 30 and switch 32 operation in response to the sensed windings resistance.

It is also a particular feature of the invention that terminals 4 and 5 are coupled across coil 30. A diode D 4, resistors R 10 and R 11 and a relay RL 1 operating switch RLS 1 are connected in series between terminals 4 and 5, thereby to provide operation of switch RLS 1 in response to the sensed energization of the motor.

According to an alternative embodiment of the invention, switch RLS 2 is eliminated and sensed low resistance of the windings only provides a sensible indication as by illumination of LED D 2 without preventing energization of the motor.

Typical component values providing operation in the best mode known to the applicant for the apparatus described above are given hereinbelow:

| D 1 | Z 12 | IN 4742 | R 1 220 ohms |
|---|---|---|---|
| D 2 | LED | LSM-L-A | R 3 |
| | | | R 4 |
| D 3 | | IN 4004 | R 7 } all 470 K Ohms |
| D 4 | | IN 4007 | R 9 |
| Rectifier 12 | WO 2 GI | | R 8 5 Ohms |
| C 1 | 100 F/25 V | | R 5 + R 2 |
| C 2 | 0.22 F/100 V | | R 6 33 KOhms |
| | | | RL 1 RS 75001 (Kaco - Germany) |
| | | | RL 2 FTA 0012405 (Feme - Italy) |

The values of R 10 and R 11 depend on the input voltage from current source 10. Where the input voltage is 110 VAC both resistors are eliminated. Where the input voltage is 220 VAC, R 10 is 27 KOhms and R 11 is eliminated. Where the input voltage is 440 VAC, R 10 is 27 KOhms and R 11 is 27 KOhms.

In accordance with an embodiment of the invention, terminals 10 and 11 may be coupled to external recording equipment, controls or alarms. In such a case, one or both of the terminals may be coupled to junction 24.

The operation of the protective apparatus described hereinabove will now be summarized. While the electric motor being monitored is at rest, the resistance between its windings and ground is continuously being compared with a reference value determined in advance by the value given to resistor R 2. When the resistance measured falls below the reference value, the light emitting diode D 2 is operated and relay RL 2 decouples terminals 7 and 8 thus deenergizing coil 30 and opening motor breaker switch 32, thereby rendering operation of the motor impossible. The motor can only be operated when relay RL 2 and switch RLS 2 are deenergized, that is when the windings resistance returns to above the predetermined threshold.

The operation of the motor on the other hand induces a voltage in coil 30 which causes operation of relay RL 1, opening switch RLS 1 and decoupling the high voltage applied to the motor windings from the protective circuitry so long as the motor is energized. This decoupling is for the purposes of preventing operation of the sensing circuitry and protecting it from possible damage caused by applied high voltage.

Figure 3:
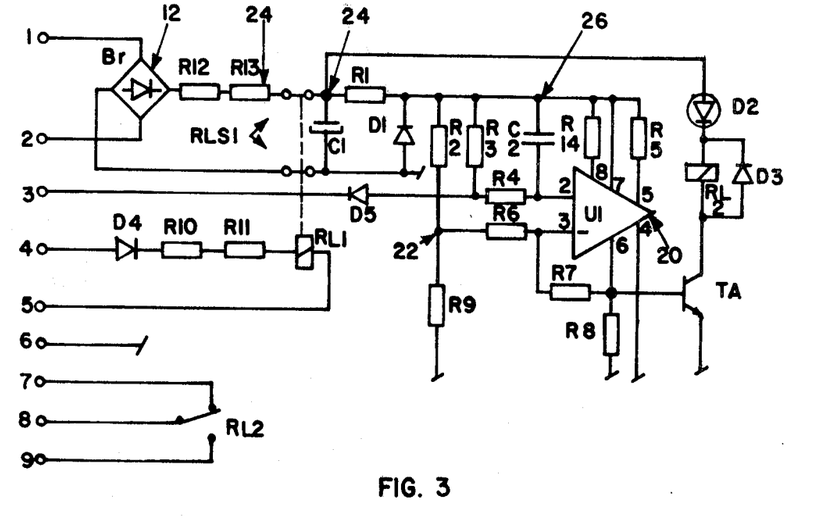
FIG. 3 is a schematic electrical diagram of sensing circuitry for a DC motor forming part of the protective system of the present invention.

Reference is now made to FIG. 3 which illustrates sensing circuitry for monitoring a DC motor. The sensing circuitry is quite similar to that illustrated in FIG. 2 herein. For the sake of simplicity of explanation, the terminal numbers employed in the description of FIGS. 1 and 2 will also be used herein. Furthermore only portions of the circuitry which differ from that in FIG. 2 will be specifically described hereinbelow. The remaining circuitry is the same as in the embodiment of FIG. 2.

Terminals 1 and 2 are directly connected to input terminals of rectifier 12 instead of passing through a transformer as in the embodiment of FIG. 2 described earlier. The transformer is thus eliminated. Two additional resistors R 12 and R 13 are arranged in series between one rectifier output and junction 24. An additional resistor R 14 is connected between bus 26 and terminal 8 of the operational amplifier 20. The parallel combination of relay RL 2 and diode D 3 which is connected to operational amplifier terminal 8 in the FIG. 2 embodiment is here connected to the collector of a transistor T 1, having a grounded emitter and a base connected to terminal 6 of the operational amplifier 20.

A diode D 5 is provided in series between terminal 3 and resistor R 4 in place of switch RLS 1. Diode D 5 serves to prevent the flow of DC current from the windings to the protective circuitry. Switch RLS - 1 is a double contact switch, one set of contacts governing the connection between resistor R 13 and junction 24 and the second set of contacts governing the connection between the second output terminal of rectifier 12 and ground. Thus the operation of relay RL 1 in response to sensed energization of the motor decouples the high voltage current source from the remainder of the protective circuitry. It is noted that in the D.C. embodiments of the invention, rectifier 12 serves to provide an output of uniform desired polarity irrespective of the input polarity.

The remainder of the circuitry is identical for all purposes to that of the embodiment of FIG. 2.

The circuitry of the embodiment of FIG. 3 is characterized by operation at relatively high supply voltages across terminals 1 and 2. The following component values differ from those exemplarily given for best mode operation of the FIG. 2 embodiment. Where new values are not given, the same values as employed in the FIG. 2 embodiment are used herein:

| | | | |
|---|---|---|---|
| C 1 | 10 F/350 V | RL 1 | RS 28001 (Kaco - Germany) |
| | | RL 2 | |
| R 1 | 68 KOhms | | |
| R 14 | 1.5 Kohms | R 10 | |
| | | R 11 | |
| R 6 | 33 KOhms | R 12 | 6.8 KOhms/1W |
| | | R 13 | |

Figure 4:
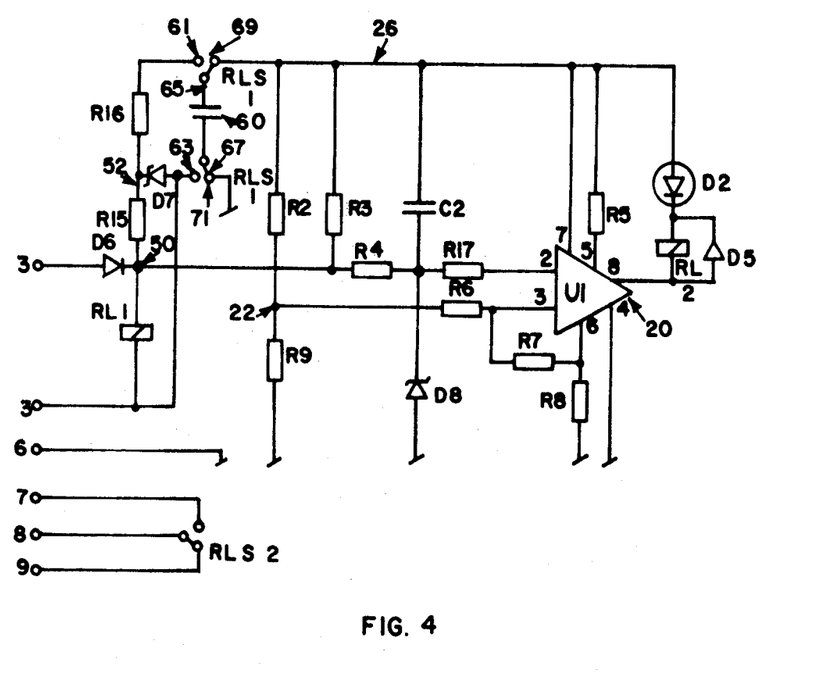
FIG. 4 is a schematic electrical diagram of sensing circuitry for a DC motor forming part of the protective system of the present invention.

Reference is now made to FIG. 4 which shows an alternative embodiment of sensing circuitry for DC motors. As in the description of the embodiment of FIG. 2, the same notation will be used for identical connections and these will not be specifically described hereinbelow.

Terminals +3 and −3 are respectively coupled to first and second motor windings, the second winding being maintained at a potential which is negative with respect to the potential of the first winding and differs therefrom typically by 220 volts. A relay RL 1 is coupled between terminals +3 and −3. Terminal +3 is coupled across a diode D 6 to a junction 50. Junction 50 is coupled via a resistor R 15 to a junction 52 which in turn is connected via a resistor R 16 to a contact 61 of a relay controlled switch RLS 1, whose operation is governed by relay RL 1. Terminal −3 is coupled to a contact 63 of relay controlled switch RLS 1 and via a Zener diode D 7 to junction 52.

A storage battery, typically of 12 V 2Ampere/hr output capacity, indicated by reference numeral 60, is coupled between change-over contacts 65 and 67 of switch RLS 1. Switch RLS 1 is arranged to couple the respective battery terminals either to a respective contacts 61 and 63 for battery recharging or to respective contacts 69 and 71, connected respectively to a bus 26 and ground, for ordinary operation. The disposition of the change-over contacts is governed by relay RL 1 in response to energization of the motor being monitored to provide ordinary battery powered operation of the sensing apparatus when the motor is at rest and to recharge the batteries when the motor is energized.

An additional resistor R 17 is inserted in series between capacitor C 2 and amplifier input terminal 2 and a Zener diode D 8 is inserted between the junction of resistors R 4 and R 17 and ground.

The following component values provide operation of the embodiment of FIG. 4 in the best mode known to the applicant. Where values are not given, the same values listed for the embodiment of FIG. 2 apply.

| | | | | |
|---|---|---|---|---|
| R 9 | | R 15 | 10 KOhms | |
| R 3 | | | | |
| R 4 | 470 KOhms | R 16 | 150 KOhms | |
| R 5 | | | | |
| R 7 | | D 6 | Silicon Diode | 400 V 0.5 A |
| R 8 | | | | |
| R 6 | 47 KOhms | D 7 | Zener Diode | 15 V ½ W |
| R 17 | | D 8 | Zener Diode | 15 V ¼ W |

Figure 5A:
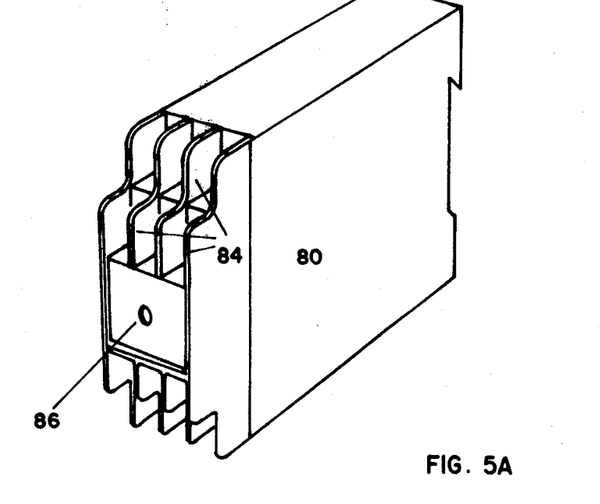
FIGS. 5A and 5B are two pictorial illustrations of a portion of the protective system of the present invention.
Figure 5B:
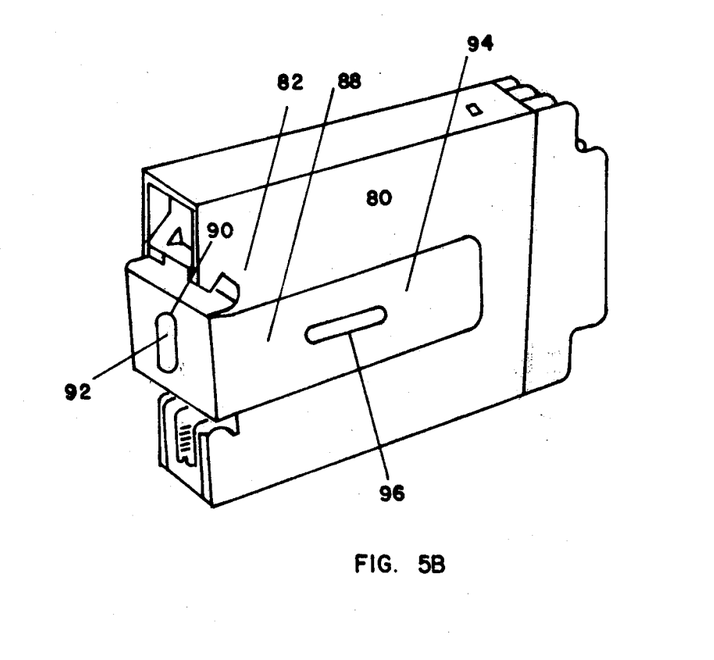

Reference is now made to FIGS. 5A and 5B which illustrate the sensing apparatus of the present invention and mounting apparatus therefor. It is a particular feature of the present invention that the sensing circuitry constructed and operative in accordance with an embodiment of the present invention is extremely compact. In accordance with an embodiment of the invention the sensing circuitry may be incorporated inside conventional overload protectors which are normally associated with large electrical motors.

According to an alternative embodiment of the invention, illustrated in FIGS. 5A and 5B, the sensing circuitry may be located within a compact connection box 80 of length approximately 11 cm, width 9 cm and thickness 2 cm. The connection box is typically formed of high impact plastic and is formed with a bayonet type connection mount 82 at the rear thereof. At the front of the connection box are a plurality of connection terminals 84 and a warning light 86 which may be the LED described in the various circuits or an external warning light for indicating low windings resistance.

It is often difficult to gain access to the rear wall of a motor control housing box for drilling mounting holes for a unit such as that provided in accordance with the present invention. In accordance with an embodiment of the invention a side mounting bar 88 may be provided, comprising a rear portion 90 formed with an aperture 92 and a side portion 94 forming a right angle with the rear portion and having a mounting slot 96 formed therein. Thus where side mounting is convenient, a mounting hole may be drilled from the outside side wall of a housing box for a screw to engage slot 96. Where rear mounting is indicated, the side portion 94 can be broken off of rear portion 90 quite readily.

Figure 6:
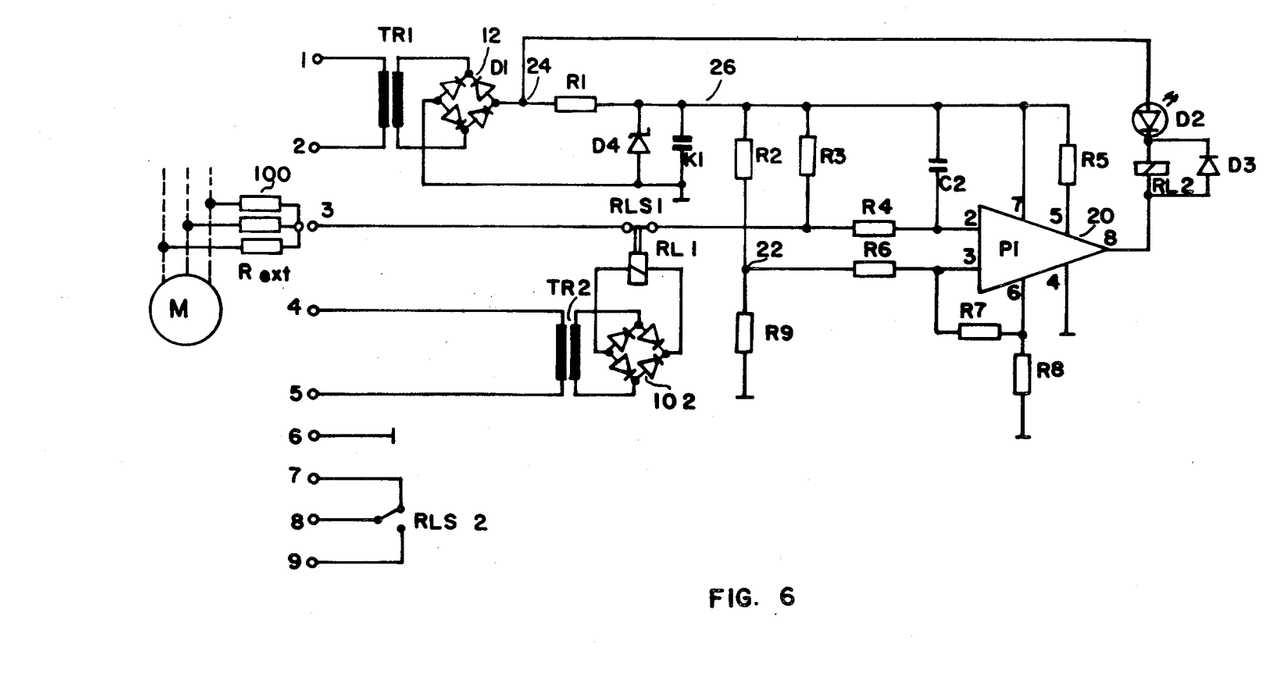
FIG. 6 is a schematic electrical diagram of sensing circuitry particularly suitable for a high voltage AC motor and forming part of the protective system of the present invention.

Reference is now made to FIG. 6 which is a schematic illustration of sensing circuitry which is particularly suitable for use with high voltage AC motors operating at 2000 volts or higher. The provision of such a protective circuit for motors operating at such high voltages is a particular feature of the present invention since no protective circuits of this type are known for such motors.

The circuitry of FIG. 6 is generally similar to the circuitry already described hereinabove in connection with FIG. 2 and the elements common to the two circuits are identified by identical reference numerals and will not be described once again at this point, for reasons of conciseness.

The major difference between the circuitry of FIG. 6 and that of FIG. 2 is in the provision of three identical resistors 100 between the respective motor windings U,V and W and terminal 3. These resistors are selected to form a star point providing a sufficient voltage drop connection to protect the sensing circuitry from the high motor winding voltages, which may be typically 2400 V line to line or even much higher.

Another difference between the circuitry of FIG. 6 and that of FIG. 2 is the provision in the embodiment of FIG. 6 of a step down transformer TR 2 across terminals 4 and 5 which are connected to the motor control coil 30. The secondary of transformer TR 2 is coupled across a rectifying bridge 102 whose rectified output is coupled to relay RL 1, typically a reed relay. Also, in place of capacitor C 1, a capacitor K 1 is connected between bus 26 and ground.

Typical component values for high voltage operation of the circuitry of FIG. 6 are as follows:

For operation at 2400 Volts and up
RLS 1 Relay and circuit according to control voltage. High Voltage reed Relays Type RA 3090 and HV 102 and V102 manufactured by Magnecraft.
RL 2 Relay Kaco 23.6 V DC nominal measured resistance 678 Ohm
K 1 Electrolytic capacitor 100 F
C 2 High Quality capacitor 470 F
TR 1 Transformer BVE1 30-Y7A T40/E 220/24V 50/60 Hz 1.8VA
TR 2
n 1 12 Bridge Rectifier: minimum requirements PIV 100V, 100mA
D 4 Zener Diode 18V 5% 1W
D 2 LED (as on other units (LSM 6L-A)
D 3 1 N 4004
p 1 20 OP. AMP CA 3094 (RCA) or Siemens TCA 315A or TCS 335A
r 1 330 OHM 1W
r 2 200 K OHM 1%
r 3 3.4 M OHM 1%
r 4 1 M OHM
r 5 220 K OHM
r 6 33 K OHM
r 7 470 K OHM 1%
r 8 56 OHM
r 9 390 K OHM 1%
r ext 100 3×1 MOHN 2% 6W at 20° C. continuous operation voltage 2000V rms It is noted that should the apparatus be used with higher motor voltages the values of resistors r ext 100 can be increased accordingly.

It will be appreciated by persons skilled in the art that the invention is not limited to the exemplary embodiments shown and described hereinabove. Rather the scope of the invention is defined only by the claims which follow.

I claim:

1. A low winding resistance protective system for electrical motors comprising:
   sensing means for coupling to at least one motor winding and for comparing the winding resistance of a motor when at rest to a predetermined threshold and for providing an output indication in response to exceedance of that threshold;
   means for decoupling the at least one motor winding from the sensing means such that high voltages applied to the at least one motor winding during operation of the motor are prevented from reaching the sensing means; and
   high capacity resistor means connected between said sensing means and said at least one motor winding.

2. Apparatus according to claim 1 and wherein said sensing means comprises an operational amplifier.

3. Apparatus according to claim 1 for AC motors and comprising rectifier means operative to convert control current received from a motor starter to direct current for supply to said sensing means.

4. Apparatus according to claim 1 wherein said means for decoupling comprises a relay actuated switch.

5. Apparatus according to claim 4 wherein said relay actuated switch is coupled to the coil of a motor starter associated with a motor for sensing by induction energization of the motor.

6. Apparatus according to claim 1 wherein said means for decoupling comprises a diode.

7. Apparatus according to claim 1 and also comprising means for selectively providing an electrical connection from a motor starter to said sensing means.

8. Apparatus according to claim 7 and wherein said selectively providing means comprises a relay controlled switch responsive to the sensed energization of the motor to disconnect said sensing means from the motor starter.

9. Apparatus according to claim 1 and also comprising means for preventing energization of the motor in response to said output indication.

10. Apparatus according to claim 1 and also comprising means for providing a visible signal in response to said output indication.

11. Apparatus according to claim 1 and wherein said sensing means are located in a compact connection box.

12. Apparatus according to claim 11 and wherein said connection box is provided with a warning light for indicating low winding resistance.

13. Apparatus according to claim 11 and also comprising a right angle mounting bar arranged for side mounting in a motor control box and to have said connection box mounted to the rear portion thereof.

14. Apparatus according to claim 11 and also comprising a mounting bar engagable with the rear of said connection box for selectable side or rear mounting of said connection box in a motor control box.

15. Apparatus according to claim 1 and wherein said sensing means are incorporated in a conventional overload protector block.

* * * * *